United States Patent
Hou et al.

(10) Patent No.: US 12,222,372 B2
(45) Date of Patent: Feb. 11, 2025

(54) CHIP TYPE COIL-BASED FLUXGATE CURRENT SENSOR

(71) Applicant: NINGBO CRRC TIMES TRANSDUCER TECHNOLOGY CO., LTD., Ningbo (CN)

(72) Inventors: Xiaowei Hou, Ningbo (CN); Yang Lv, Ningbo (CN); Liangguang Zheng, Ningbo (CN); Shengping Zhu, Ningbo (CN); Po Zhang, Ningbo (CN); Peng Wu, Ningbo (CN)

(73) Assignee: NINGBO CRRC TIMES TRANSDUCER TECHNOLOGY CO., LTD., Ningbo (CN)

( * ) Notice: Subject to any disclaimer, the term of this patent is extended or adjusted under 35 U.S.C. 154(b) by 54 days.

(21) Appl. No.: 18/005,528

(22) PCT Filed: Sep. 11, 2020

(86) PCT No.: PCT/CN2020/114833
§ 371 (c)(1),
(2) Date: Jan. 13, 2023

(87) PCT Pub. No.: WO2022/036776
PCT Pub. Date: Feb. 24, 2022

(65) Prior Publication Data
US 2023/0280376 A1 Sep. 7, 2023

(30) Foreign Application Priority Data

Aug. 18, 2020 (CN) .......................... 202010833286.7

(51) Int. Cl.
*G01R 15/20* (2006.01)
(52) U.S. Cl.
CPC .................. *G01R 15/20* (2013.01)

(58) Field of Classification Search
None
See application file for complete search history.

(56) References Cited

U.S. PATENT DOCUMENTS

| | | | |
|---|---|---|---|
| 2015/0210732 A1* | 7/2015 | Cailly | C07H 1/00 544/91 |
| 2015/0219732 A1* | 8/2015 | Diamond | A61B 5/0042 324/201 |
| 2019/0067164 A1* | 2/2019 | Noma | H01L 21/3065 |

FOREIGN PATENT DOCUMENTS

| | | |
|---|---|---|
| CN | 101410723 A | 4/2009 |
| CN | 101907690 A | 12/2010 |

(Continued)

OTHER PUBLICATIONS

International Search Report dated May 13, 2021 from PCT Application No. PCT/CN2020/114833.

*Primary Examiner* — Farhana A Hoque
(74) *Attorney, Agent, or Firm* — INNOVATION CAPITAL LAW GROUP, LLP; Vic Lin

(57) ABSTRACT

A chip type coil-based fluxgate current sensor, comprising: a magnetism gathering iron core, a chip type coil, an integral filtering module, a signal driving module, a voltage acquisition module, and a signal amplification module which are connected in sequence. The chip type coil comprises a first high-resistance silicon wafer and a second high-resistance silicon wafer which are bonded with each other; a built-in cavity is formed between involution surfaces of first high-resistance silicon wafer and second high-resistance silicon wafer, and multiple solenoid cavities filled with coil materials are provided around the periphery of the cavity; a cavity opening is formed at one end after involution of first high-resistance silicon wafer and second high-resistance silicon wafer. The magnetism gathering iron core is inserted into the cavity of the chip type coil by means of the cavity (Continued)

opening. The present current sensor is small in size and stable in signal.

7 Claims, 5 Drawing Sheets

(56) References Cited

FOREIGN PATENT DOCUMENTS

| | | | |
|---|---|---|---|
| CN | 104808042 A | 7/2015 | |
| CN | 105866713 A | 8/2016 | |
| CN | 106291405 A | 1/2017 | |
| CN | 205941858 U | 2/2017 | |
| CN | 205958729 U | 2/2017 | |
| CN | 107367288 A | 11/2017 | |
| CN | 206959858 U | 2/2018 | |
| CN | 109085410 A | 12/2018 | |
| CN | 109507474 A | 3/2019 | |
| CN | 110146832 A | 8/2019 | |
| CN | 110988430 A | 4/2020 | |
| JP | 2010145147 A | 7/2010 | |
| JP | 2018179689 A | 11/2018 | |

* cited by examiner

CHIP TYPE COIL-BASED FLUXGATE CURRENT SENSOR

BACKGROUND OF THE INVENTION

1. Technical Field

The invention relates to the technical field of magnetic field detection sensors, in particular to a chip type coil-based fluxgate current sensor.

2. Description of Related Art

The fluxgate probe is a key part of fluxgate current sensors. Common fluxgate probes are typically made by winding a three dimensional solenoid coil on a strip-shaped magnetic core. Such fluxgate probes are easy to make, but are large in volume and size, high in mass production cost, large in assembly error, low in matching degree of the iron core and the coil, likely to be affected by temperature, stress and mechanical vibrations, and large in output error, and have to be frequently calibrated in the later stage. With the continuous development of magnetic field detection technologies and intellectualization, the requirements for miniaturization of fluxgate current sensors are becoming increasingly higher. So, new technologies are needed to drastically decrease the size of probes, especially the size of three-dimensional solenoid coils, and a miniaturized fluxgate current sensors needs to be developed.

BRIEF SUMMARY OF THE INVENTION

In view of the above-mentioned problems, the objective of the invention is to provide a chip type coil-based fluxgate current sensor.

To fulfill the above objective, the invention provides a chip type coil-based fluxgate current sensor, comprising a magnetism gathering iron core, a chip type coil, an integral filtering module, a signal driving module, a voltage acquisition module, and a signal amplification module which are connected in sequence;

the chip type coil comprises a first high-resistance silicon wafer and a second high-resistance silicon wafer which are bonded with each other; a built-in cavity is formed between involution surfaces of the first high-resistance silicon wafer and the second high-resistance silicon wafer, and multiple solenoid cavities filled with coil materials are provided around the periphery of the cavity; a cavity opening is formed at one end after involution of the first high-resistance silicon wafer and the second high-resistance silicon wafer;

the magnetism gathering iron core is inserted into the cavity of the chip type coil by means of the cavity opening.

Further, the chip type coil is a chip type three dimensional solenoid coil.

Further, the chip type coil-based fluxgate current sensor further comprises a feedback coil;

The feedback coil is used for generating a magnetic field opposite to a magnetic field generated by a primary-side current, and feeding the generated magnetic field back to the magnetism gathering iron core.

Further, the chip type coil-based fluxgate current sensor further comprises a self-excited oscillation circuit module;

the self-excited oscillation circuit module is used for detecting a current of the chip type coil, reversing square waves of the chip type coil, and driving the chip type coil.

Further, the integral filtering module is used for receiving a voltage signal output after the chip type coil senses a detected magnetic field, and processing the voltage signal to obtain a corresponding current signal.

Further, the signal driving module is used for receiving the current signal of the integral filtering module and driving the feedback coil according to the received current signal.

Further, the signal driving module comprises a sampling resistor.

Further, the voltage acquisition module is used for acquiring a voltage signal of the sampling resistor of the signal driving module.

Further, the signal amplification module is used for receiving the voltage signal acquired by the voltage acquisition module and amplifying the acquired voltage signal to obtain a voltage signal in preset proportion with the primary-side current.

Further, the magnetism gathering iron core is a soft magnetism gathering iron core.

The invention has at least the following beneficial effects: the fluxgate current sensor is a chip type coil-based fluxgate current sensor, and the volume and size of a probe are greatly reduced, such that the size of the fluxgate current sensor is greatly reduced, and miniaturized and series development of the current sensor is realized.

DETAILED DESCRIPTION OF THE INVENTION

The technical solution of the invention will be further described below in conjunction with specific embodiments and accompanying drawings of the invention. Obviously, the invention is not limited to the following embodiments.

Embodiment

This embodiment provides a chip type coil-based fluxgate current sensor. As shown in FIG. 1 to FIG. 5, the chip type coil-based fluxgate current sensor comprises: a magnetism gathering iron core, a chip type coil, an integral filtering module, a signal driving module, a voltage acquisition module, and a signal amplification module which are connected in sequence;

the chip type coil comprises a first high-resistance silicon wafer and a second high-resistance silicon wafer which are bonded with each other; a built-in cavity is formed between involution surfaces of the first high-resistance silicon wafer and the second high-resistance silicon wafer, and multiple solenoid cavities filled with coil materials are provided around the periphery of the cavity; a cavity opening is formed at one end after involution of the first high-resistance silicon wafer and the second high-resistance silicon wafer;

the magnetism gathering iron core is inserted into the cavity of the chip type coil by means of the cavity opening.

Traditional enameled coils are made by winding a three dimensional solenoid coil on a strip-shaped magnetic coil, so such coils are large in volume and size, high in mass production cost, large in assembly error, low in matching degree of the iron core and the coil, likely to be affected by temperature, stress and mechanical vibrations, and large in output error, and have to be frequently calibrated in the later stage.

Figure 1:
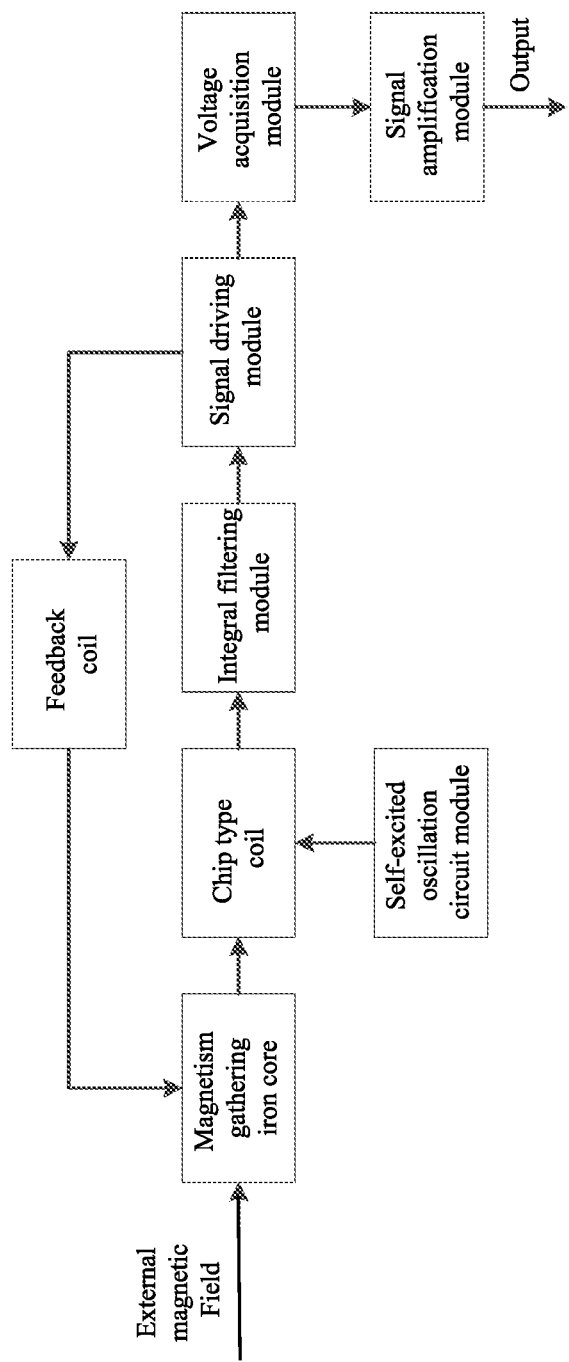
FIG. 1 is a structural block diagram of a chip type coil-based fluxgate current sensor.
Figure 2:
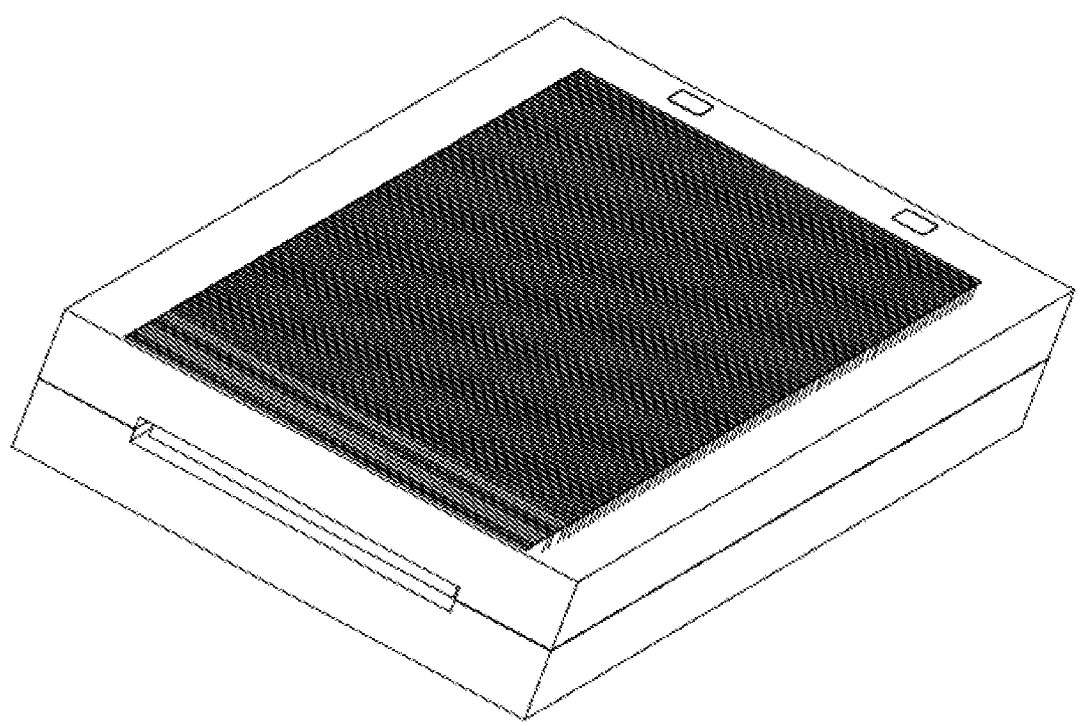
FIG. 2 is a structural diagram of the tail of a chip type coil.

In view of the problems of traditional enameled coils, as shown in FIG. 2, this embodiment provides the chip type coil-based fluxgate current sensor provided with a cavity, and soft magnetic materials are inserted into the cavities in the chip type coil of the fluxgate current sensor to form a chip type fluxgate probe used for magnetic field detection.

Figure 3:
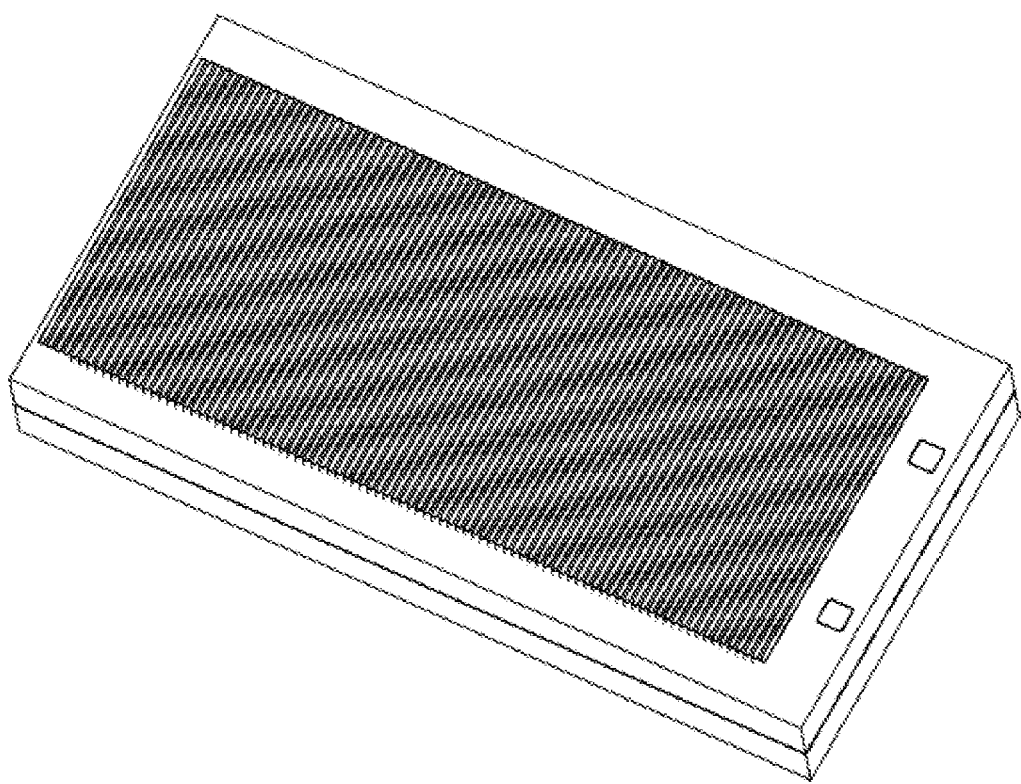
FIG. 3 is a structural diagram of the head of the chip type coil.
Figure 4:
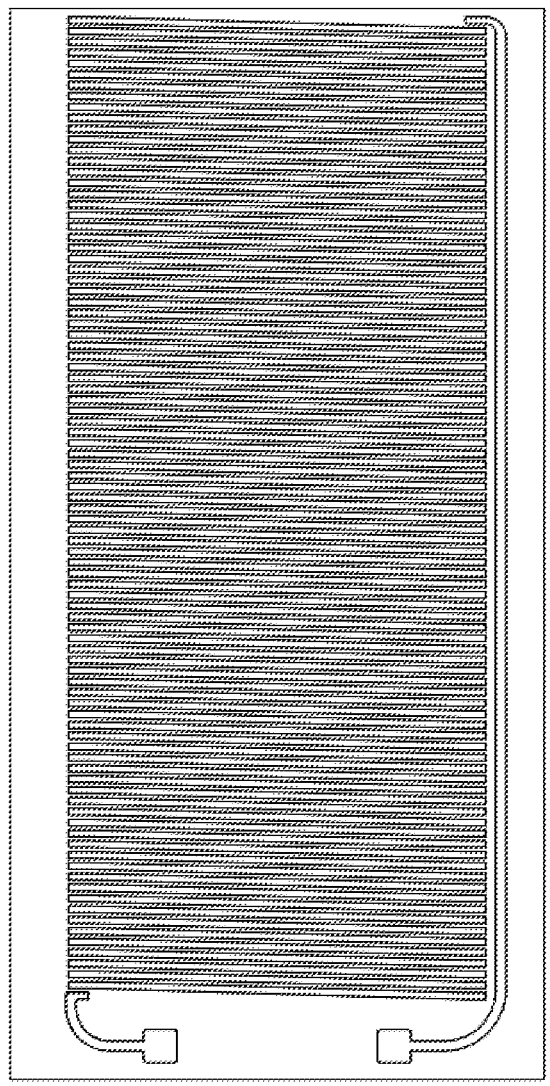
FIG. 4 is a front view of the chip type coil.
Figure 5:
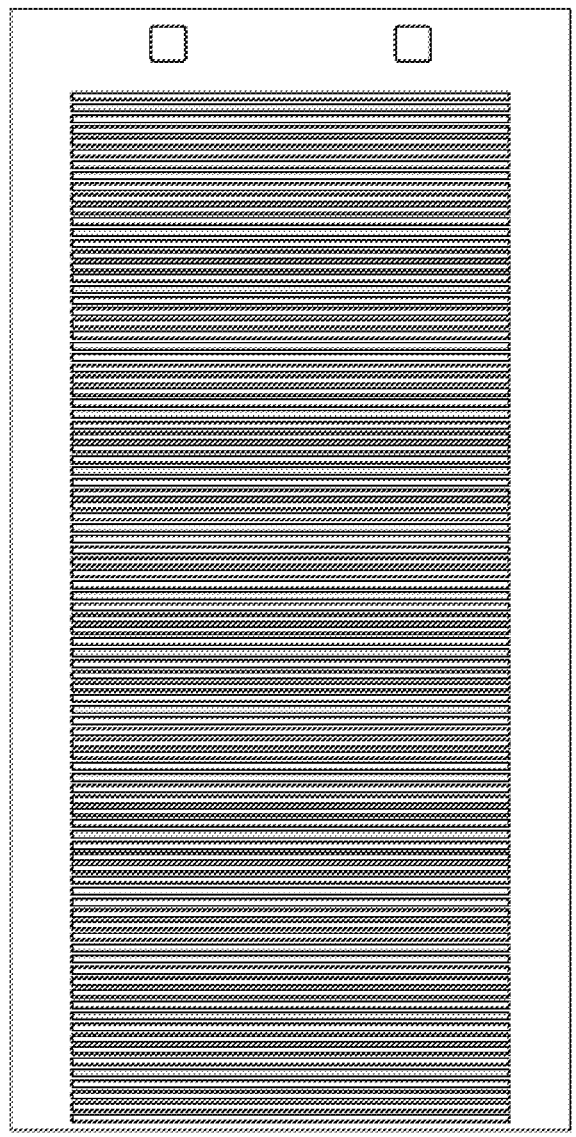
FIG. 5 is a back view of the chip type coil.

As shown in FIG. 3 to FIG. 5:

Further, the chip type coil is a chip type three dimensional solenoid coil.

According to the chip type coil-based fluxgate current sensor provided by this embodiment, the size of the fluxgate current sensor is greatly reduced. The size of the chip type three dimensional solenoid coil used for the fluxgate current sensor is only about one sixth of the size of enameled coils, the size of the fluxgate current sensor can be reduced by several times due to the decrease of the size of the three dimensional coil. Accordingly, the size of the fluxgate current sensor using the chip type coil is decreased by several times, and the miniaturization of the fluxgate current sensor is further improved.

Further, the chip type coil-based fluxgate current sensor further comprises a feedback coil;

The feedback coil is used for generating a magnetic field opposite to a magnetic field generated by a primary-side current, and feeding the generated magnetic field back to the magnetism gathering iron core.

Further, the chip type coil-based fluxgate current sensor further comprises a self-excited oscillation circuit module;

The self-excited oscillation circuit module is used for detecting a current of the chip type coil, reversing square waves of the chip type coil, and driving the chip type coil.

Further, the integral filtering module is used for receiving a voltage signal output after the chip type coil senses a detected magnetic field, and processing the voltage signal to obtain a corresponding current signal.

Further, the signal driving module is used for receiving the current signal obtained by the integral filtering module and driving the feedback coil according to the received current signal.

Further, the signal driving module comprises a sampling resistor.

Further, the voltage acquisition module is used for acquiring a voltage signal of the sampling resistor of the signal driving module.

Further, the signal amplification module is used for receiving the voltage signal acquired by the voltage acquisition module and amplifying the acquired voltage signal to obtain a voltage signal in preset proportion with the primary-side current.

Further, the magnetism gathering iron core is a soft magnetism gathering iron core.

According to the fluxgate current sensor provided by this embodiment, a primary-side current generates a magnetic field, which is gathered through the magnetism gathering iron core, the chip type coil (also referred to as a magnetic field detection element) senses a detected magnetic field, an output voltage signal is processed by the integral filtering module to obtain a current signal, then the signal driving module drives the feedback coil according to the current signal, the feedback coil generates a magnetic field opposite to the magnetic field generated by the primary-side current, the voltage acquisition module acquires a voltage signal of the sampling resistor on a channel of the signal driving module, and the voltage signal is amplified by the signal amplification module to obtain a voltage signal in proportion with the primary-side current.

The volume and size of the chip type coil-based fluxgate current sensor provided by this embodiment are greatly reduced, the cost is reduced, the overall size of the corresponding fluxgate sensor can be greatly reduced, and the mass production level can be improved. Due to the fact that assembly errors are small, the error level of signals can be further reduced, the consistency and stability are better, and the signal processing difficulty of a back-end circuit is lowered.

The specific embodiments described in this specification are merely used to explain the spirit of the invention by way of examples. Those skilled in the art can make various amendments, supplements or similar substitutions to these specific embodiments without departing from the spirit of the invention or exceeding the scope defined by the appended claims.

What is claimed is:

1. A chip type coil-based fluxgate current sensor, comprising a magnetism gathering iron core, a chip type coil, an integral filtering module, a signal driving module, a voltage acquisition module, and a signal amplification module which are connected in sequence;
   the chip type coil comprises a first high-resistance silicon wafer and a second high-resistance silicon wafer which are bonded with each other; a built-in cavity is formed between involution surfaces of the first high-resistance silicon wafer and the second high-resistance silicon wafer, and multiple solenoid cavities filled with coil materials are provided around a periphery of the cavity; a cavity opening is formed at one end after involution of the first high-resistance silicon wafer and the second high-resistance silicon wafer;
   the magnetism gathering iron core is inserted into the cavity of the chip type coil by means of the cavity opening;
   further comprising a feedback coil and a self-excited oscillation circuit module; the feedback coil is used for generating a magnetic field opposite to a magnetic field generated by a primary-side current, and feeding the generated magnetic field back to the magnetism gathering iron core; the self-excited oscillation circuit module is used for detecting a current of the chip type coil, reversing square waves of the chip type coil, and driving the chip type coil;
   the integral filtering module is used for receiving a voltage signal output after the chip type coil senses a detected magnetic field, and processing the voltage signal to obtain a corresponding current signal.

2. The chip type coil-based fluxgate current sensor according to claim 1, wherein the chip type coil is a chip type three dimensional solenoid coil.

3. The chip type coil-based fluxgate current sensor according to claim 1, wherein the signal driving module is used for receiving the current signal of the integral filtering module and driving the feedback coil according to the received current signal.

4. The chip type coil-based fluxgate current sensor according to claim 3, wherein the signal driving module comprises a sampling resistor.

5. The chip type coil-based fluxgate current sensor according to claim 4, wherein the voltage acquisition module is used for acquiring a voltage signal of the sampling resistor of the signal driving module.

6. The chip type coil-based fluxgate current sensor according to claim 5, wherein the signal amplification module is used for receiving the voltage signal acquired by the voltage acquisition module and amplifying the acquired voltage signal to obtain a voltage signal in preset proportion with the primary-side current.

7. The chip type coil-based fluxgate current sensor according to claim 1, wherein the magnetism gathering iron core is a soft magnetism gathering iron core.

* * * * *